(12) United States Patent
Subramaniam

(10) Patent No.: US 7,046,175 B1
(45) Date of Patent: May 16, 2006

(54) SYSTEMS AND METHODS FOR DECODING COMPRESSED DATA

(75) Inventor: Girish Subramaniam, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 11/139,121

(22) Filed: May 27, 2005

Related U.S. Application Data

(62) Division of application No. 10/679,099, filed on Oct. 3, 2003, now Pat. No. 6,903,669.

(51) Int. Cl.
*H03M 7/00* (2006.01)

(52) U.S. Cl. ............... 341/106; 341/65; 341/67
(58) Field of Classification Search ............... 341/59, 341/65, 67, 106
See application file for complete search history.

(56) References Cited

U.S. PATENT DOCUMENTS

| | | | | |
|---|---|---|---|---|
| 4,868,570 A | * | 9/1989 | Davis | 341/106 |
| 5,821,887 A | * | 10/1998 | Zhu | 341/67 |
| 6,081,783 A | * | 6/2000 | Divine et al. | 704/500 |
| 6,433,709 B1 | * | 8/2002 | Oue | 341/67 |
| 6,504,496 B1 | * | 1/2003 | Mesarovic et al. | 341/106 |
| 6,650,996 B1 | * | 11/2003 | Beesley et al. | 701/200 |
| 6,782,318 B1 | * | 8/2004 | Beesley et al. | 701/200 |
| 6,903,669 B1 | * | 6/2005 | Subramaniam | 341/106 |

* cited by examiner

*Primary Examiner*—Peguy JeanPierre
*Assistant Examiner*—Khai Nguyen
(74) *Attorney, Agent, or Firm*—Thompson & Knight LLP; James J. Murphy

(57) ABSTRACT

A decoding method includes extracting a preselected number of bits from a bitstream to be decoded, accessing a table entry of a table using an index generated in response to the extracted bit, and if a first value in the table entry indicates a second value in the table entry comprises a decoded result, retrieving the decoded result.

13 Claims, 15 Drawing Sheets

DECODE TABLE 1

| INDEX | RESULT FLAG | OFFSET | NUMBER OF ADDITIONAL BITS |
|---|---|---|---|
| 0 | | | |
| 1 | | | |
| 2 | | | |
| 3 | | | |
| ⋮ | | | |
| J | | | |

BASE ADDRESS T1

POINTER 610 → 3

DECODE TABLE 2

| 0 | | | |
|---|---|---|---|
| 1 | | | |
| 2 | | | |
| ⋮ | | | |
| K | | | |

BASE ADDRESS T2

POINTER 610 → 2

⋮

DECODE TABLE P

| 0 | | | |
|---|---|---|---|
| 1 | | | |
| 2 | | | |
| 3 | | | |
| 4 | | | |
| 5 | | | |
| 6 | | | |
| ⋮ | | | |
| L | | | |

BASE ADDRESS TP

POINTER 610 → 4

DECODE TABLE 1

| | INDEX 604 | RESULT FLAG 606 | OFFSET 608 | NUMBER OF ADDITIONAL BITS 610 | |
|---|---|---|---|---|---|
| BASE ADDRESS T1 | 0 | | | | ⎫ |
| | 1 | | | | ⎬ TABLE 1 |
| 602 → | 2 | | | | |
| | 3 | | | | |
| | ⋮ | | | | |
| | J | | | | ⎭ |
| | 0 | | | | ⎫ |
| | 1 | | | | |
| BASE ADDRESS T2 | 2 | | | | ⎬ TABLE 2 |
| | ⋮ | | | | |
| | K | | | | ⎭ |
| | ⋮ | | | | ⎬ TABLE 3 - TABLE P-1 |
| | 0 | | | | ⎫ |
| | 1 | | | | |
| | 2 | | | | |
| | 3 | | | | |
| | 4 | | | | ⎬ TABLE P |
| BASE ADDRESS TP | 5 | | | | |
| | 6 | | | | |
| | ⋮ | | | | |
| | L | | | | ⎭ |

*FIG. 6B*

|  | INDEX 802 | RESULT FLAG 804 | OFFSET 806 | NUMBER OF ADDITIONAL BITS 808 |
| --- | --- | --- | --- | --- |
| BASE ADDRESS TABLE 1 | 0 | "1" | RESULT 1 | |
| | 1 | "1" | RESULT 2 | |
| | 2 | "0" | 10 | 01 |
| ENTRY 810 → | 3 | "0" | 11 | 10 |
| BASE ADDRESS TABLE 2 | 4 | "1" | RESULT 3 | |
| | 5 | "1" | RESULT 4 | |
| ENTRY 812 → BASE ADDRESS TABLE 3 | 6 | "1" | RESULT 5 | |
| | 7 | "1" | RESULT 6 | |
| | 8 | "1" | RESULT 7 | |
| ENTRY 814 → | 9 | "0" | 01 | 10 |
| BASE ADDRESS TABLE 4 | 10 | "1" | RESULT 8 | |
| ENTRY 816 → | 11 | "1" | RESULT 9 | |
| | 12 | "1" | RESULT 10 | |
| | 13 | "1" | RESULT 11 | |

Table 1: rows 0–3. Table 2: rows 4–5. Table 3: rows 6–9. Table 4: rows 10–13.

FIG. 8

| CODE BOOK | M-ARY SEARCH | BINARY SEARCH | TWO-STEP TABLE LOOKUP |
|---|---|---|---|
| HCB_1 | 49 | 81 | 160 |
| HCB_2 | 56 | 81 | 113 |
| HCB_3 | 59 | 81 | 793 |
| HCB_4 | 53 | 81 | 226 |
| HCB_5 | 54 | 81 | 288 |
| HCB_6 | 54 | 81 | 166 |
| HCB_7 | 43 | 64 | 218 |
| HCB_8 | 46 | 64 | 123 |
| HCB_9 | 114 | 169 | 603 |
| HCB_10 | 114 | 169 | 290 |
| HCB_11 | 183 | 289 | 408 |
| HCB_SF | 82 | 121 | 2060 |

SYSTEMS AND METHODS FOR DECODING COMPRESSED DATA

CROSS-REFERENCE TO RELATED APPLICATION

The present application is a divisional of U.S. application Ser. No. 10,679,099, filed Oct. 3, 2003 is now a U.S. Pat. No. 6,903,669.

BACKGROUND OF THE INVENTION

1. Field of the Invention

The present invention relates in general to digital signal processing and in particular to systems and methods for decoding data applied in a compressed format in such digital processing systems.

2. Description of the Related Art

Modern signal processing systems, such as those found, for example, in commercial and consumer audio products, commonly receive streamed data in compressed formats, thereby reducing bandwidth requirements on the data transport channels. This compressed format has been, at least in part, spurred by the use of the Internet as a medium for the distribution of audio and video content, in addition to the textual information that typified the early years of the Internet. Additionally, the traditional broadcast media, radio and television, for example, are introducing direct digital broadcast channels over which content will be streamed to consumers.

The use of coding techniques to compress the digital data prior to its being sent over the communication channel, reduces the bandwidth requirements that the channel must support. Conversely, a channel having a fixed bandwidth can accommodate more data streams, if the data streams are in a compressed format.

For example, the MPEG-4 audio standard provides a set of protocols for encoding audio signals. The protocols include a complete set of tools for coding low and high bit rate, natural and synthetic speech and music. A general audio coding portion of MPEG-4 is based on the MPEG-2 Advanced Audio enCoding (AAC) standard. AAC has become very popular because it preserves audio quality, making it advantageous, particularly for high quality audio systems.

Nonetheless, the properties of AAC complicate AAC decoder implementations. Memory requirements may be substantial, particularly in the case of multi-channel audio. Additionally, AAC provides a multiplicity of bit rates, tools, and profiles defined within the AAC specification. Additionally, the algorithms in the AAC definition have been designed to be implemented on a thirty-two-bit (32-bit) floating point engine. These characteristics of AAC impose stringent demands on the AAC decoder in an audio system by underlying MIPS and/or cost requirements complicated.

In particular, an AAC encoded audio stream may be compressed using a Huffman compression scheme selected from one of twelve Huffman codebooks (HCB) specified within the AAC. Moreover, the encoder may, dynamically, select the HCB depending on the characteristics of the audio source. Consequently, there is a need in the art for systems and methods to decode compressed audio bitstreams, such as those in accordance with the MPEG-4 AAC, and other encoding schemes, that operate within a selected MIPS budget, memory size and/or cost efficiency.

SUMMARY OF THE INVENTION

According to the principles of the present invention a method for decoding an encoded bitstream is disclosed. The method includes performing an "M-ary" table lookup in which the number of bits extracted from the bitstream varies with the stage of the decode. A first table is addressed in response to a first plurality of bits from the bitstream. The method includes extracting a preselected number of bits from the bitstream. An index generated in response to the extracted bits is used to access the table. If a first value in the entry accessed using the index generated in response to the extracted bits indicated a second value in the entry represents a decoded result, the decoded result is retrieved from the entry. Otherwise, a next entry in the table is accessed.

The inventive concepts allow for the decoding of a bitstream constituting a sequence of encoded digital data, such as digital audio information encoded using variable-length code words, such as Huffman encoding. Implementation of the inventive principles does not require an inordinate amount of look-up table memory or the execution of a burdensome number of additional instructions.

BRIEF DESCRIPTION OF THE DRAWINGS

For a more complete understanding of the present invention, and the advantages thereof, reference is now made to the following descriptions taken in connection with the accompanying drawings, in which:

FIGS. 6A and 6B schematically illustrate a set of decode tables in accordance with the present inventive principles;

FIG. 8 illustrates, in tabular form, decode table corresponding to the exemplary codebook of FIG. 7 in accordance with the present invention;

FIG. 10 illustrates, in tabular form, the memory usage of the storage of data structures for decoding the MPEG Advanced Audio enCoding (AAC) Huffman codebooks.

DETAILED DESCRIPTION

Figure 1A:
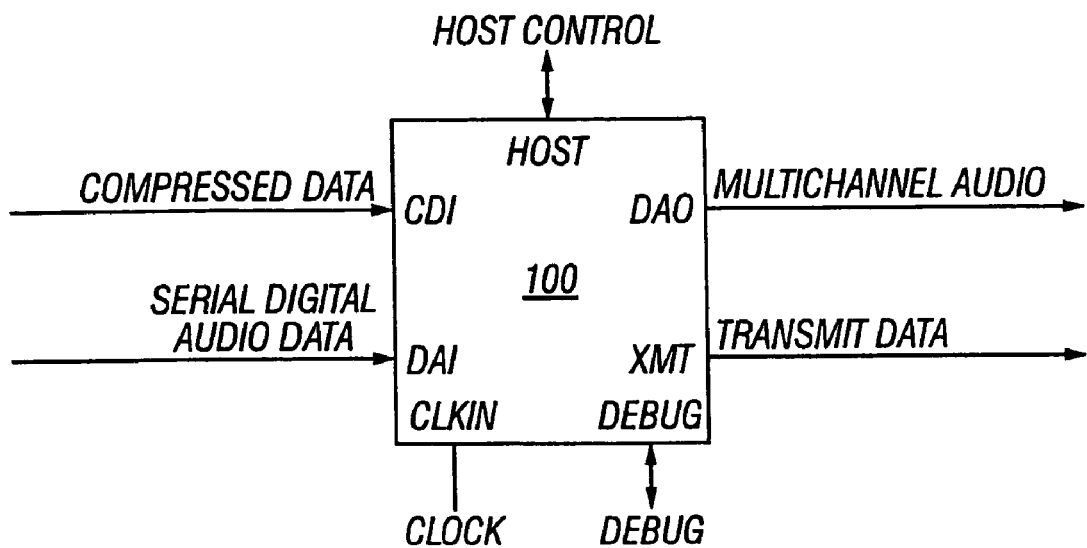
FIG. 1A is a diagram of a multi-channel audio decoder employing the principles of the present invention.

In the following description, numerous specific details are set forth, such as specific encoding protocols, codebooks, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1A is a general overview of an audio information decoder 100. Decoder 100 is operable to receive data in any one of a number of formats, including compressed data conforming, for example, to the MPEG-4 AAC algorithm (as defined in ISO/IEC 14493-3 standard promulgated by the International Organization for Standards (ISO)) and AC-3 digital audio compression standard, (as defined by the United States Advanced Television System Committee) through a Compressed Data Input port ("CDI"). An independent Digital Audio Input ("DAI") port provides for the input of PCM, S/PDIF, or non-compressed digital audio data.

A digital audio output ("DAO") port provides for the output of multiple-channels of decompressed digital audio data. Independently, decoder 100 can transmit data in an S/PDIF ("Sony-Phillips Digital Interface") format, for example, through a transmit port XMT.

Decoder 100 operates under the control of a host microprocessor through a host port "HOST" and supports debugging by an external debugging system through the debug port "DEBUG." The "CLK" port supports the input of a master clock for generation of the timing signals within decoder 100.

Figure 1B:
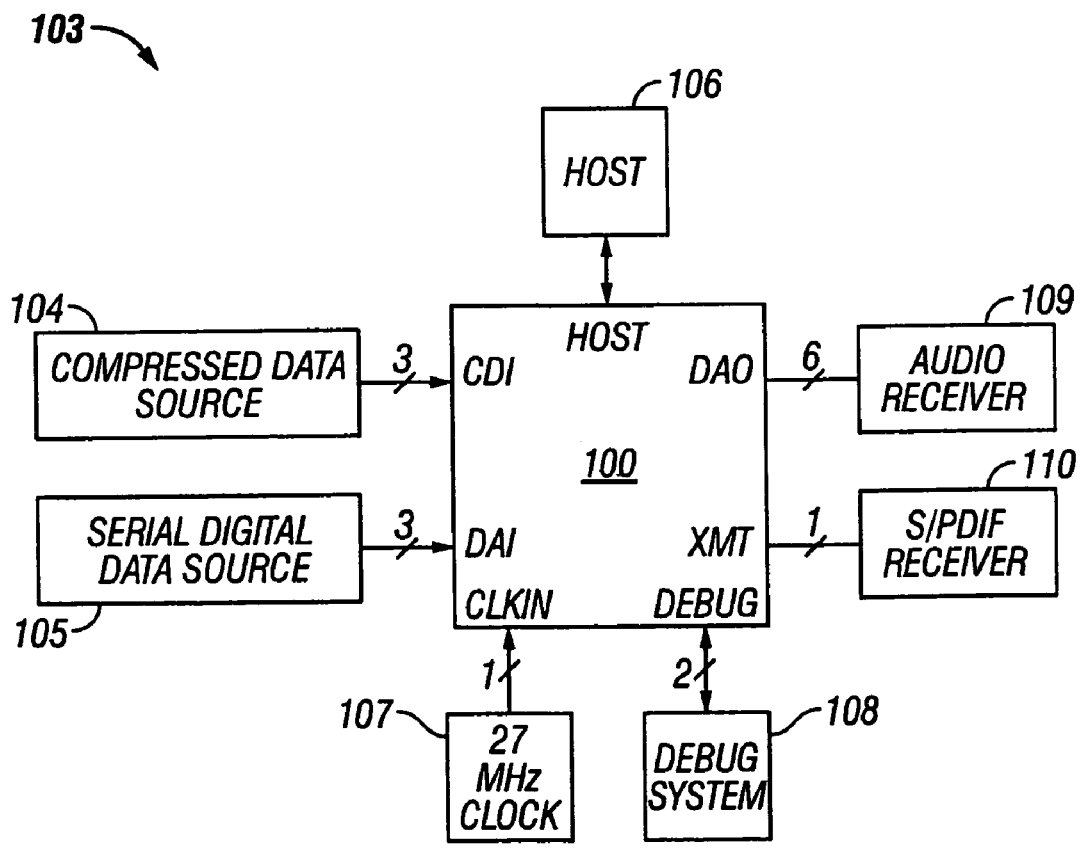
FIG. 1B is a diagram showing the decoder of FIG. 1A in an exemplary system context.

FIG. 1B shows decoder 100 embodied in a representative system 103. Decoder 100 as shown includes three Compressed Data Input (CDI) pins for receiving compressed data from a compressed audio data source 104 and an additional three Digital Audio Input (DAI) pins for receiving serial digital audio data from digital audio sources 105. Examples of compressed serial digital audio source 105, and in particular of AAC compressed digital sources, are satellite and terrestrial digital TV and radio broadcasting and the Internet.

The HOST port allows coupling to a host processor 106, which is generally a microcontroller or microprocessor that maintains control over the audio system 103. For instance, in one embodiment, host processor 106 is the microprocessor in a Personal Computer ("PC"), and System 103 is a PC-based sound system. In another embodiment, host processor 106 is a microcontroller in an audio receiver or controller unit, and system 103 is a non-PC-based entertainment system, such as conventional home entertainment systems produced by Sony, Pioneer, and others. A master clock, shown here, is generated externally by clock source 107. The DEBUG port consists of two lines for connection with an external debugger, which is typically a PC-based device.

Decoder 100 has six output lines for outputting multichannel audio digital data (DAO) to digital audio receiver 109 in any one of a number of formats including 3-lines out, 2/2/2, 4/2/0, 4/0/2 and 6/0/0. A transmit port (XMT) allows for the transmission of S/PDIF data to a S/PDIF receiver 110. These outputs may be coupled, for example, to digital to analog converters or codes for transmission to analog receiver circuitry.

Figure 1C:
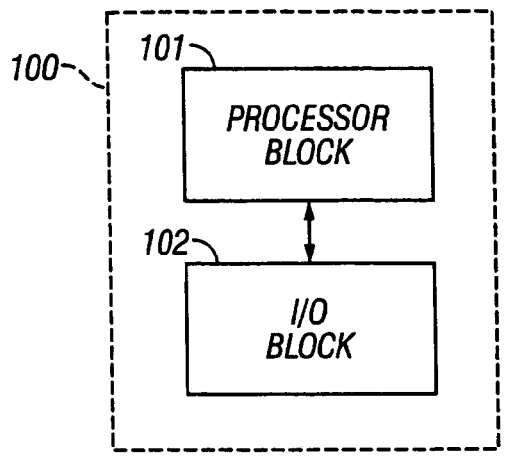
FIG. 1C is a diagram showing the partitioning of the decoder into a processor block in an input/output (I/O) block.

FIG. 1C is a high-level functional block diagram of a multichannel audio decoder 100 embodying the principles of the present invention. Decoder 100 is divided into two major sections, a Processor Block 101 and the I/O Block 102. Processor Block 106 includes two digital signal processor (DSP) cores, DSP memory, and system reset control. I/O Block 102 includes interprocessor communication registers, peripheral I/O units with their necessary support logic, and interrupt controls. Blocks 101 and 102 communicate via interconnection with the I/O buses of the respective DSP cores. For instance, I/O Block 102 can generate interrupt requests and flag information for communication with Processor Block 101. All peripheral control and status registers are mapped to the DSP I/O buses for configuration by the DSPs.

Figure 2:
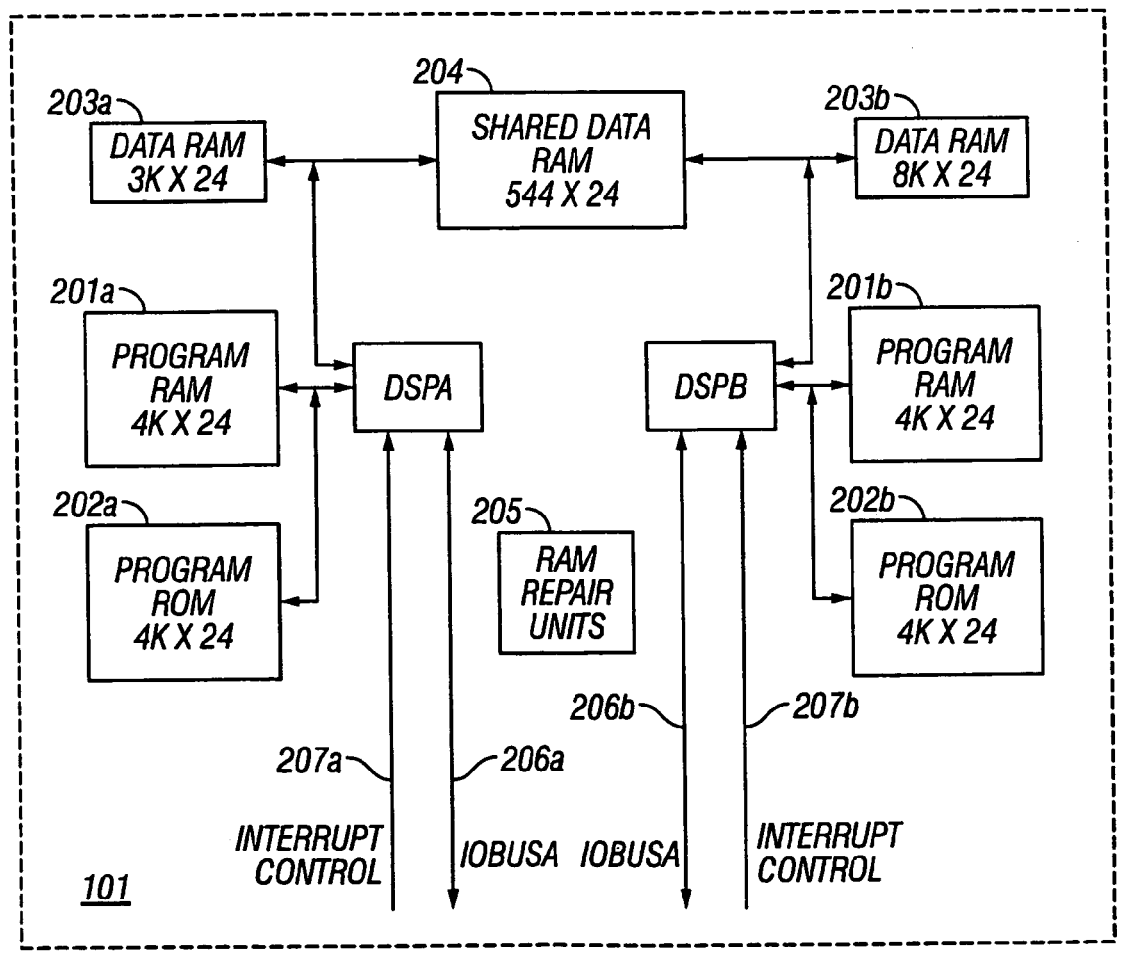
FIG. 2 is a diagram of the processor block of FIG. 1C.

FIG. 2 is a detailed operational block diagram of processor block 101. Processor block 101 includes two DSP cores 200a and 200b, labeled DSPA and DSPB respectively. Cores 200a and 200b operate in conjunction with respective dedicated program RAM 201a and 201b, program ROM 202a and 202b, and data RAM 203a and 203b. Shared data RAM 204, which the DSPs 200a and 200b can both access, provides for the exchange of data, such as PCM data and processing coefficients, between processors 200a and 200b. Processor block 101 also contains a RAM repair unit 205 that can repair a predetermined number of RAM locations within the on-chip RAM arrays to increase die yield.

DSP cores 200a and 200b respectively communicate with the peripherals through I/O Block 102 via their respective I/O buses 206a, 206b. The peripherals send interrupt and flag information back to the processor block via interrupt interfaces 207a, 207b.

Figure 3:
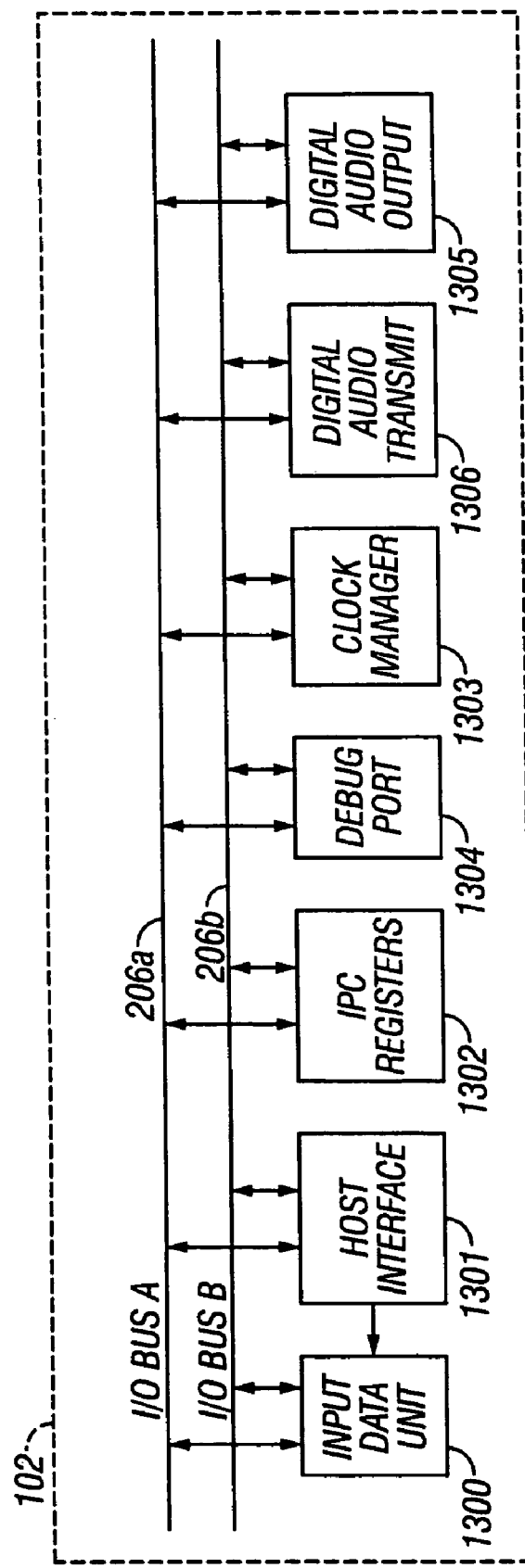
FIG. 3 is a diagram of the primary functional subblocks of the I/O block of FIG. 1C.

FIG. 3 is a detailed operational block diagram of I/O block 102. Generally, I/O block 102 contains peripherals for data input, data output, communications, and control. Input Data Unit 1300 accepts either compressed analog data or digital audio in any one of several input formats (from either the CDI or DAI ports). Serial/parallel host interface 1301 allows an external controller to communicate with decoder 100 through the HOST port. Data received at the host interface port 1301 can also be routed to input data unit 1300.

IPC (Inter-processor Communication) registers 1302 support a control-messaging protocol for communication between processing cores 200 over a relatively low-bandwidth communication channel. High-bandwidth data can be passed between cores 200 via shared memory 204 in processor block 101.

Clock manager 1303 is a programmable PLL/clock synthesizer that generates common audio clock rates from any selected one of a number of common input clock rates through the CLKIN port. Clock manager 1303 includes an STC counter, which generates time information used by processor block 101 for managing playback and synchronization tasks. Clock manager 1303 also includes a programmable timer to generate periodic interrupts to processor block 101.

Debug circuitry 1304 is provided to assist in applications development and system debug using an external DEBUGGER and the DEBUG port, as well as providing a mechanism to monitor system functions during device operation.

A Digital Audio Output port 1305 provides multichannel digital audio output in selected standard digital audio formats. A Digital Audio Transmitter (TRANSMIT) 1306 provides digital audio output in formats compatible with S/PDIF or AES/EBU.

In general, I/O registers are visible on both I/O buses, allowing access by either DSPA (200*a*) or DSPB (200*b*). Any read or write conflicts are resolved by treating DSPB as the master and ignoring DSPA.

In the discussion below, the AAC decoding approach is discussed for understanding the utility and advantages of the concepts claimed below. It would be appreciated by one of ordinary skill in the art that the actual claims, however, will determine the scope of the invention, and that the principles of the present invention may be applied to other encoding schemes.

The AAC approach provides a number of useful functions. For example, the AAC approach provides for a speed change operation, which allows the change of the time scale without altering the pitch during the decoding process. This approach can, for example, be used to implement a "fast forward" operation (data base search) or to adapt the length of an audio sequence to a given video sequence. A pitch change operation allows the change of the pitch without altering the time scale during the encoding or decoding process. This feature can be used for example for voice alteration or Karaoke-type applications. Bit rate scalability allows a bitstream to be parsed into a bitstream of lower bit rate, such that the combination can still be decoded into a meaningful signal. The bitstream parsing can occur either during transmission or in the decoder. Bandwidth scalability is a particular case of bitrate scalability, whereby part of a bitstream representing a part of the frequency spectrum can be discarded during transmission or decoding. Encoder complexity scalability allows encoders of different complexity to generate valid and meaningful bitstreams. Decoder complexity scalability allows a given bitstream to be decoded by decoders of different levels of complexity. The audio quality, in general, is related to the complexity of the encoder and decoder used. Error robustness provides the ability for a decoder to avoid or conceal audible distortion caused by transmission errors.

The AAC encoded signals are reconstructed into PCM samples, which are temporarily stored in PCM buffers, and sent to output FIFOs for playback. Given the dynamics of the AAC decode and the available MIPS, the PCM buffers and the output FIFOs have to be designed properly. The output FIFOs act as Direct Memory Access ("DMA") engines, feeding decompressed audio data to Digital-to-Analog Converters ("DACs"), and are designed at the hardware level, while the PCM buffers are the PCM sample reserves created in software to smooth out the data delivery-decode-playback dynamics. Preferably, the output FIFOs are chosen to be a 32-sample (24-bit) size.

Figure 4:
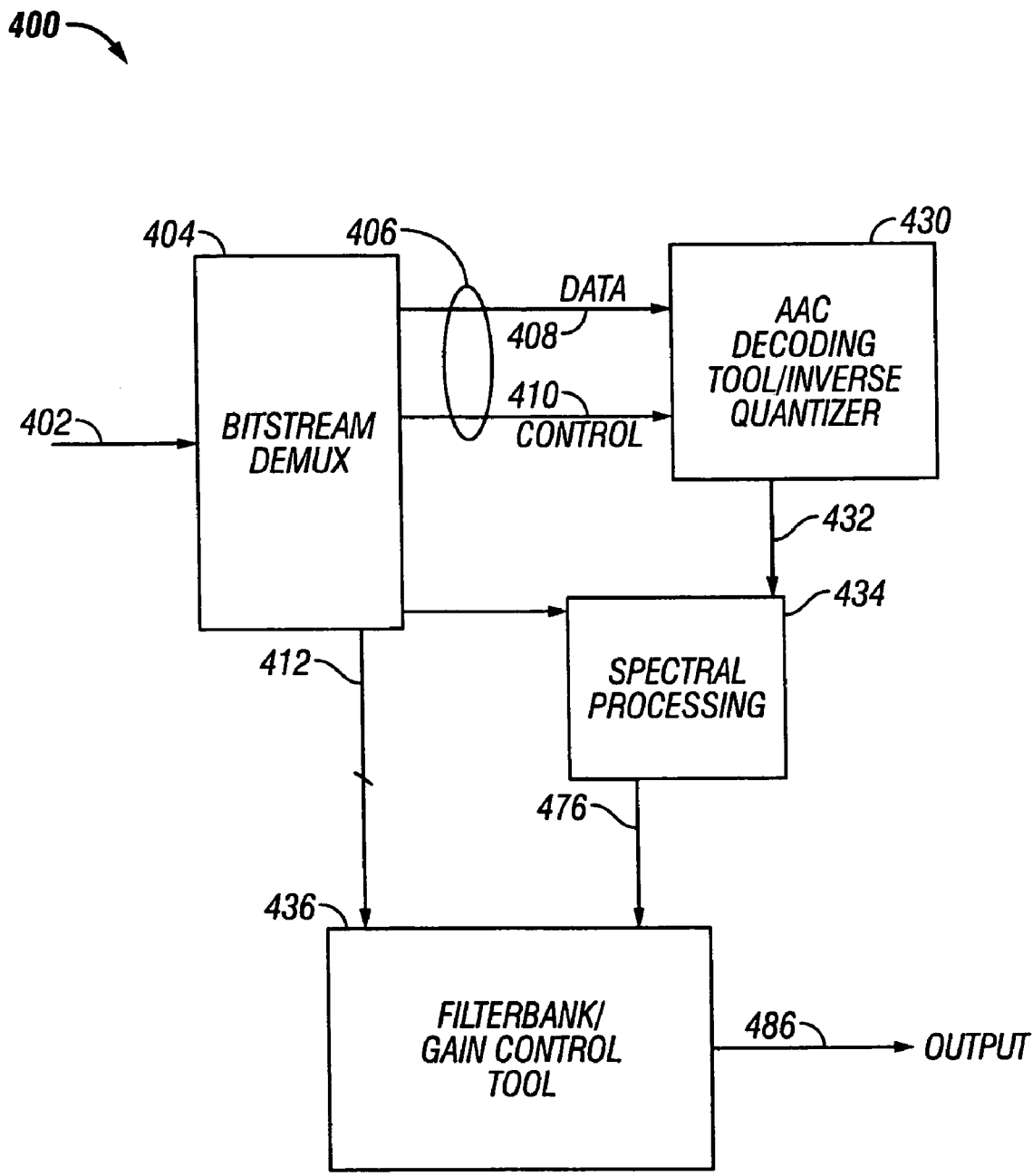
FIG. 4 is a high level block diagram of a decoding architecture in accordance with the principles of the present invention.

A high-level block diagram of a coding/decoding architecture 400 is shown in FIG. 4. Architecture 400 may be used in conjunction with decoder 100, FIGS. 1A and 1B. The operations of the decoder are to find the description of the quantized audio spectra in the bitstream, decode the quantized values and other reconstruction information, reconstruct the quantized spectra, process the reconstructed spectra through whatever tools are active in the bitstream in order to arrive at the actual signal spectra as described by the input bitstream, and finally convert the frequency domain spectra to the time domain, with or without an optional gain control tool. Following the initial reconstruction and scaling of the spectrum reconstruction, other circuitry can be used to modify one or more of the spectra in order to provide more efficient coding. Preferably for these additional circuits, there is maintained an option to "pass through" the data without spectral modification.

Bitstream 402 is input to bitstream demultiplexer (DE-MUX) tool 404. Bitstream 402 may be an MPEG-2 AAC bitstream. The demultiplexer separates the bitstream into the parts for each tool and provides each of the tools with the bitstream information related to that tool.

The output from the bitstream demultiplexer tool 404 may include the quantized (and preferably noiselessly coded) spectra represented by: (1) the sectioning information and the noiselessly coded spectra 406 (AAC) (including data 408 and control information 410); (other such information, for example, Bit-Sliced Arithmetic Coding ("BSAC") information or a set of indices of code vectors (TwinVQ) may also be provided, but are not shown in FIG. 4, for simplicity) and (2) the filterbank and gain control information 41 (Other control information may also be provided, but are not shown in FIG. 4, for simplicity. A detailed discussion of these features may be found in the commonly owned, co-pending U.S. patent application Ser. No. 09/771,103 entitled "PCM BUFFERING SYSTEM AND METHOD," which is hereby incorporated herein by reference.

The AAC noiseless decoding tool 430 takes information from the bitstream demultiplexer 404, parses that information, decodes the Huffman coded data, and reconstructs the quantized spectra and the Huffman and differentially coded scalefactors. The AAC specification defines twelve Huffman codebooks, eleven of which may be used to encode the quantized spectra (hereinbelow denoted HCB_1–HCB-11) and the twelfth (hereinbelow denoted HCB_SF) utilized to encode the scalefactors. The codebook descriptor corresponding to codebook utilized to encode the data is provided to AAC noiseless decoding tool 430 by bitstream demultiplexer 404 in the sectioning information and the noiselessly coded spectra 406.

The inputs to the noiseless decoding/inverse-quantizer/scalefactor tool 430 are the sectioning information for the noiselessly coded spectra 406. The outputs of the noiseless decoding tool are the decoded integer representation of the scalefactors and the quantized values for the spectra 432.

The inverse-quantizer tool portion takes the quantized values for the spectra, which were generated by the AAC noiseless decoding portion of tool 430 and converts the integer values to non-scaled, reconstructed spectra. This quantizer is a non-uniform quantizer. The input to the inverse-quantizer tool portion is the quantized values for the spectra and the output of the inverse quantizer tool is the unscaled, inversely quantized spectra. The scalefactor tool portion converts the integer representation of the scalefactors to the actual values and multiplies the unscaled inversely quantized spectra by the relevant scalefactors. The inputs to the scalefactors tool are the decoded integer representation of the scalefactors and the unscaled, inversely quantized spectra. The output from the scalefactors tool is the scaled, inversely quantized spectra. These are provided as spectra 432 to spectral processing tool 434.

Spectral processing tool 434 performs noise and other signal processing on the spectra 432, including the inversion of processing performed at the encoder. Spectral processing tool 434 receives control information 410 from bitstream demultiplexer 402. A description of the signal processing performed by spectral processing tool 434 may be found in the commonly owned, co-pending U.S. patent application Ser. No. 09/771,103 entitled "PCM BUFFERING SYSTEM AND METHOD," which has been incorporated herein by reference.

The filterbank/gain control tool 436 applies the inverse of the frequency mapping that was carried out in the encoder, as indicated by the filterbank/gain control information 412 and the presence or absence of gain control information. An IMDCT may be used for the filterbank tool. If the gain control tool is not used, the IMDCT in the standard AAC mode input may consist of either 1024 or 128 spectral coefficients, depending on the value of the window sequence. If the gain control tool is used, the filterbank tool 436 may be configured to use four sets of either 256 or 32 coefficients, depending on the value of the window sequence.

The inputs to the filterbank tool 436 are the inversely quantized spectra 476 and the filterbank/gain control information 412. The output(s) from the filterbank tool is (are) the time domain reconstructed audio signal(s) 486. The filterbank tool 436 may be constructed from different configurations: a) 1024 or 128 shift-length-type with the option to select two window shapes (AAC); b) 4× switchable 256 or 32 shift-length-type with the option to select two window shapes (AAC); c) 2048 or 512 or 128 shift-length-type with a sine window as defined for TwinVQ; and d) 960 or 120 shift-length-type with the option to select two window shapes (AAC-derived).

The gain control tool 436 (which may be omitted in an alternative embodiment of decoding architecture 400) applies a separate time domain gain control to each of four frequency bands that have been created by the gain control PQF filterbank in the encoder and then assembles the four frequency bands and reconstructs the time waveform through the gain control tool's filterbank.

The inputs to the gain control tool are the time domain reconstructed audio signal(s) and the gain control information. The output from the gain control tool is the time domain reconstructed audio signal(s). If the gain control tool is not active, then the time domain reconstructed audio signal(s) are passed directly from the filterbank tool to the output of the decoder. This tool is used for the Scaleable Sampling Rate ("SSR") profile only.

The above audio coding/decoding tools are used, for example, in the AAC architecture specification which is set out in the ISO/IEC CD 14496-3 Subpart 4 Standard, entitled "Information Technology—Coding of Audiovisual Objects; Part 3: Audio; Subpart 4: Time/Frequency Coding, dated 1998, May 15", which is incorporated by reference herein.

AAC algorithms use large and very flexible filterbanks to perform the time and frequency representation of the signal. For example, both 128—and 1024—sample windows are utilized in AAC's filterbank. The 128—sample windows (short windows) are preferably utilized to capture transients, while the 1024—sample windows (long windows) are preferably utilized to achieve high compression ratios and good frequency resolution for stationary signals. Furthermore, transitions from long to short (and vice versa) windows are supported.

For a complete description of exemplary decoder 100 and its advantages, reference is now made to coassigned U.S. Pat. No. 6,081,783 entitled "DIGITAL AUDIO DECODING CIRCUITRY, METHODS AND SYSTEMS".

Figure 5:
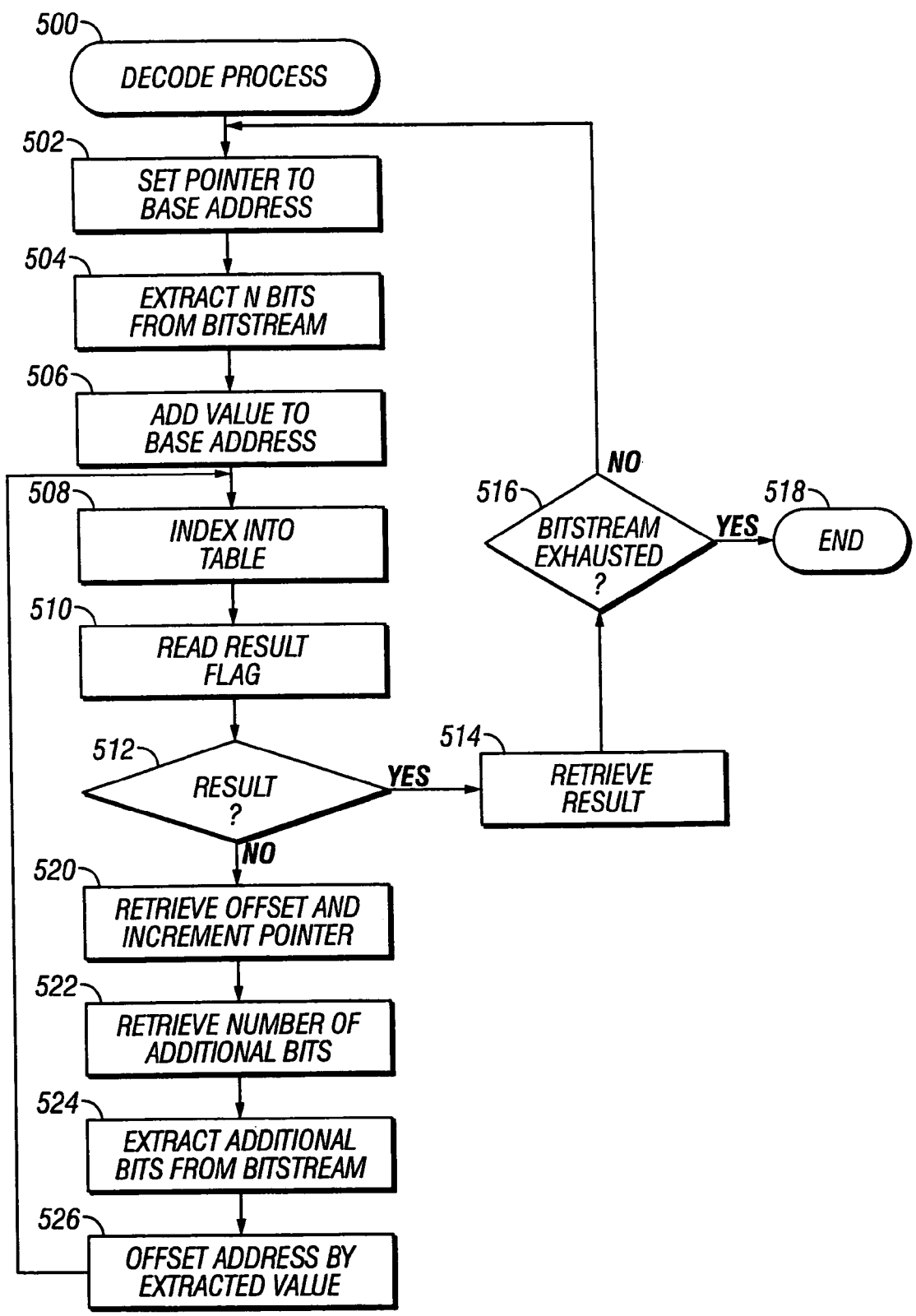
FIG. 5 illustrates, in flow chart form, a decoding methodology in accordance with an embodiment of the present invention.

Referring now to FIG. 5, a decode process 500 is shown in flow chart form. Decode process 500 decodes an encoded bitstream, that is, a bitstream that constitutes a stream of code words representing an audio or other signal source. (Process 500 may be performed by decoder 100 of FIGS. 1A–1C. In one embodiment, process 500 may be performed by decoding tool 430, FIG. 4. In step 502, a pointer is set to a first base address of a M-ary decode table in accordance with the present inventive principles. The terminology M-ary has been introduced as a mneumonic device to denote that the number of bits extracted from the bitstream varies at each stage of the decoding of a code word in the bitstream. The number of bits depends on the location of the current stage in the codebook. The number of bits extracted may range from 1 . . . n, where n is the size of the target code word in the codebook. This methodology contrasts with other table-lookup decode methods, such as the two-table mechanism in the coassigned U.S. Pat. No. 6,504,496, entitled "SYSTEMS AND METHODS FOR DECODING COMPRESSED DATA," of Mesarovic et al. briefly discussed further hereinbelow, in which a fixed number of bits are extracted from the bitstream at each stage. An M-ary decode table includes P subtables. (The subtables may simply be referred to collectively as tables or decode tables when the context does not require distinguishing a particular subtable or subtables.) The number, P, depends on the particular codebook utilized to encode the bitstream. A subtable starts when the length of the next code word, or set of code words, increases. As described below in conjunction with FIG. 9, the codebook may be sorted in increasing order of code word length to generate the decode table. A methodology for generating the M-ary decode table process will be described hereinbelow in conjunction with FIG. 9. The tables may be stored in any nonvolatile memory system, such as a ROM, flash memory, or disk memory. The tables are accessed by an addressing scheme for the memory, which stores the tables. The tables may be stored in contiguous blocks of memory. Embodiments of an M-ary decode table are illustrated in FIG. 6A (subtables stored in discontiguous blocks of memory) and FIG. 6B (subtables in contiguous blocks of memory).

Referring now to FIGS. 6A and 6B, each subtable (labeled Decode tables 1 to P), includes a plurality of entries 602. Each entry includes a plurality of fields 604–608. Field 604 contains an index. Field 606 contains a result flag, which may be one bit wide. Field 608 contains an offset and field 610 a number of additional bits to extract from the bitstream. Alternatively, the concatenated values contained in fields 608 and 610 may represent the result, that is the decoded value of a particular code word. Whether the values in fields 608 and 610 represent an offset and additional bits, respectively, or, alternatively, a decoded result is signaled by the value of the result flag in field 606. The use of the values contained in these fields will be described in conjunction with decode process 500 of FIG. 5. The entries in the decode tables may be accessed by addressing the memory locations which store the tables via pointer 610. The base address set in step 502 of FIG. 5 is the address of the first entry of the first subtable of the set of P subtables.

Returning to FIG. 5, in step 504, N bits are extracted from the bitstream. The number N may represent the smallest code word in the codebook utilized to encode the bitstream. In AAC, for example, the algorithms are adaptive, and the encoding of the bitstream may be dynamically changed. In AAC, the encoder can select from one of twelve Huffman codebooks. As described above, the bitstream itself may include control data that contains, among other things, information that specifies the encoding scheme, or codebook, utilized to encode the data bitstream (that is, a code descriptor). Furthermore, because the encoder may change the coding scheme dynamically, the control information may change. Thus, those of ordinary skill in the art would appreciate that for the purpose of the present invention, the number N may be presumed to be known.

In step 506, the value represented by the N bits extracted in step 504 are added to the pointer (that is the base address) set in step 502. The pointer is utilized to index into the decoder tables in step 508, and, in step 510, the result flag is read. As described hereinabove, the value of the result flag signals if the values contained in the offset and additional bits to extract fields represent a result or are an offset and additional number of bits to "grab" extracts from the bitstream. Any pair of predetermined values may be utilized to signal the alternatives, however a single bit suffices. For example, a value of "1" may signal that the values in the fields (concatenated) represents a result, that is a decoded code word, and the complementary value, "0", signals that the values do not represent a result but an address offset and an additional grab from the bitstream and used as described hereinbelow.

If, in step 512, the result flag signals that the entry indexed in step 508 contains a result, that is a decoded code word, the result is retrieved in step 514, as described further hereinbelow. The entry to which the pointer points will contain a result when the sequence of bits in the bitstream that have been processed in accordance with process 500 represent a code word in the Huffman codebook utilized to encode the bitstream. If the bits processed do not represent a code word, additional bits are extracted and processed, as discussed hereinbelow in conjunction with steps 520–526. The result may represent a PCM sample as discussed hereinabove in conjunction with AAC encoded audio bitstreams. In other words, the principles of the present invention are applicable to any Huffman encoded data. The bitstream could, for example, represent encoded text, and the result could, for example, represent an ASCII or Unicode character representation. Thus, the aggregate width of the offset (such as field 606, FIGS. 6A and 6B) and the number of bits to grab (such as field 608, FIGS. 6A and 6B) may be determined by the bit length of the decoded result. For example, a decoded AAC bitstream may have twenty-four bit PCM samples, an ASCII character result may be eight bits, and a Unicode character result may be sixteen bits in length. If, in step 516, the bitstream is exhausted, process 500 terminates in step 518. Otherwise, process 500 returns to step 502 to continue decoding the remaining portion of the bitstream.

Returning to step 512, if the result flag signals that the contents of the offset and additional bits fields do not represent a decoded code word (for example, the result flag is "0"), in step 520 the offset value is retrieved. The value may be contained in offset field 608 in an embodiment of an M-ary decode table 600 of FIGS. 6A and 6B. In step 522, the number of additional bits to extract from the bitstream is retrieved. The number of additional bits to extract may be contained in field 610 in an embodiment of an M-ary decode table 600 of FIGS. 6A and 6B. In step 524, the additional bits are extracted from the bitstream, and in step 526, the offset retrieved in step 520 is added to the present value of the pointer (equivalently, index) to generate the base address of the next subtable of the M-ary decode table. Process 500 returns to step 508 and indexes into the next subtable M-ary decode table using the index value generated in step 526. Steps 508, 512 and 520–526 are repeated until the sequence of bits thus retrieved represent a next code word, in which the entry to which the pointer points contains a result, as described in conjunction with step 514, above. Process 500 continues to process the bitstream until the bitstream is exhausted at step 516.

Figure 7:
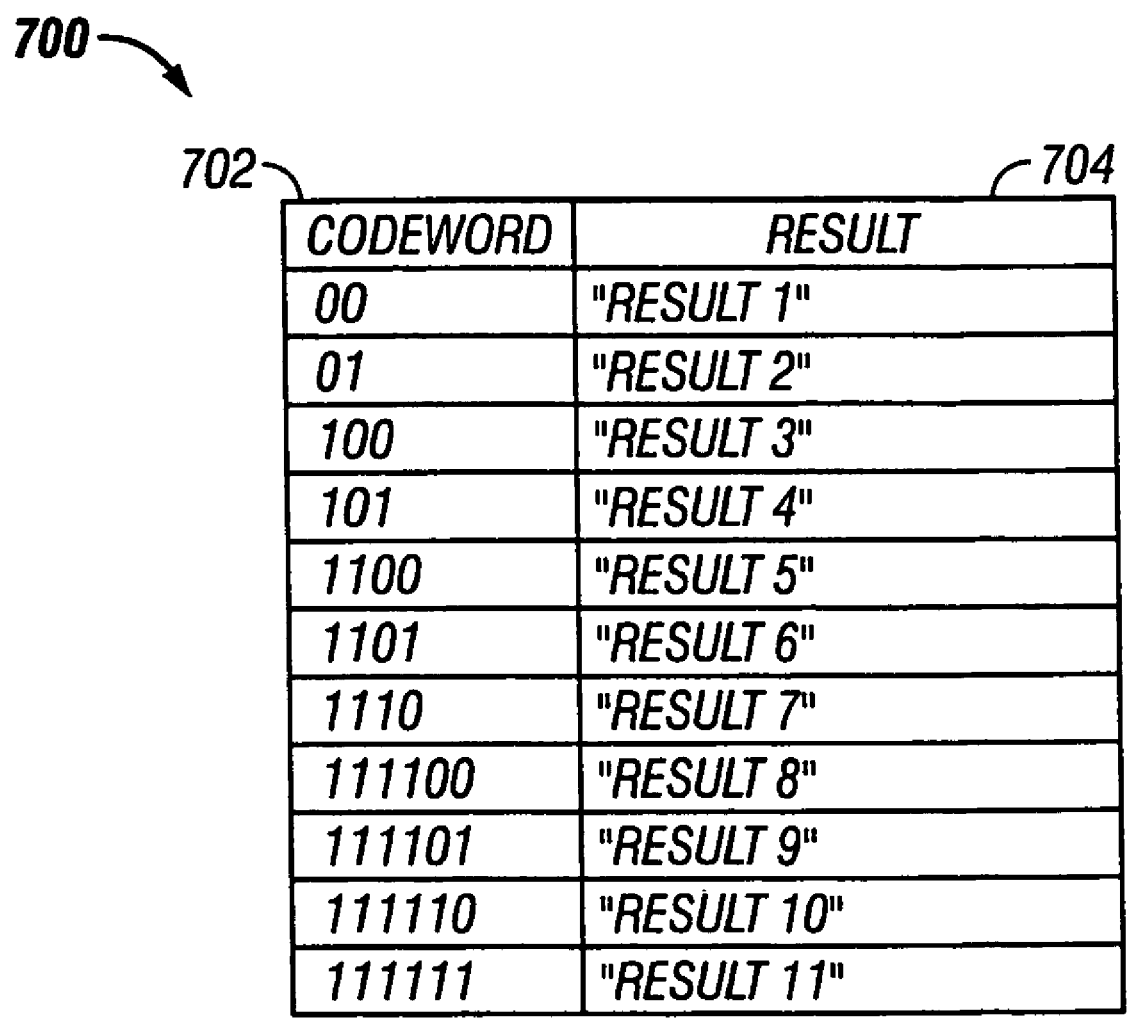
FIG. 7 illustrates, in tabular form, an exemplary codebook which may be used to illustrate the methodology of FIG. 5.
Figure 9A:
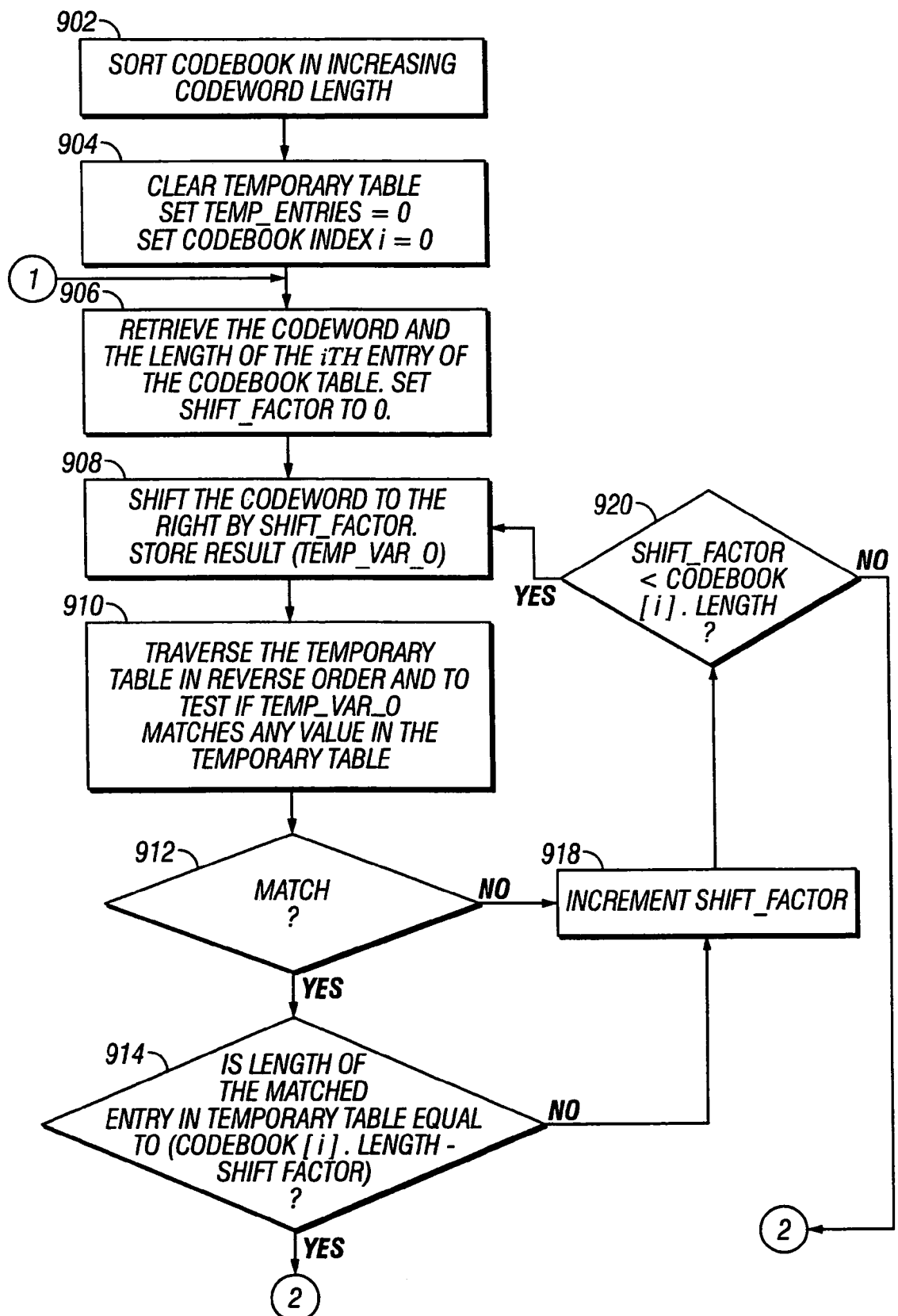
FIGS. 9A–9D illustrate, in flow chart form, a process to generate the M-ary decode tables in accordance with an embodiment of the present invention.
Figure 9B:
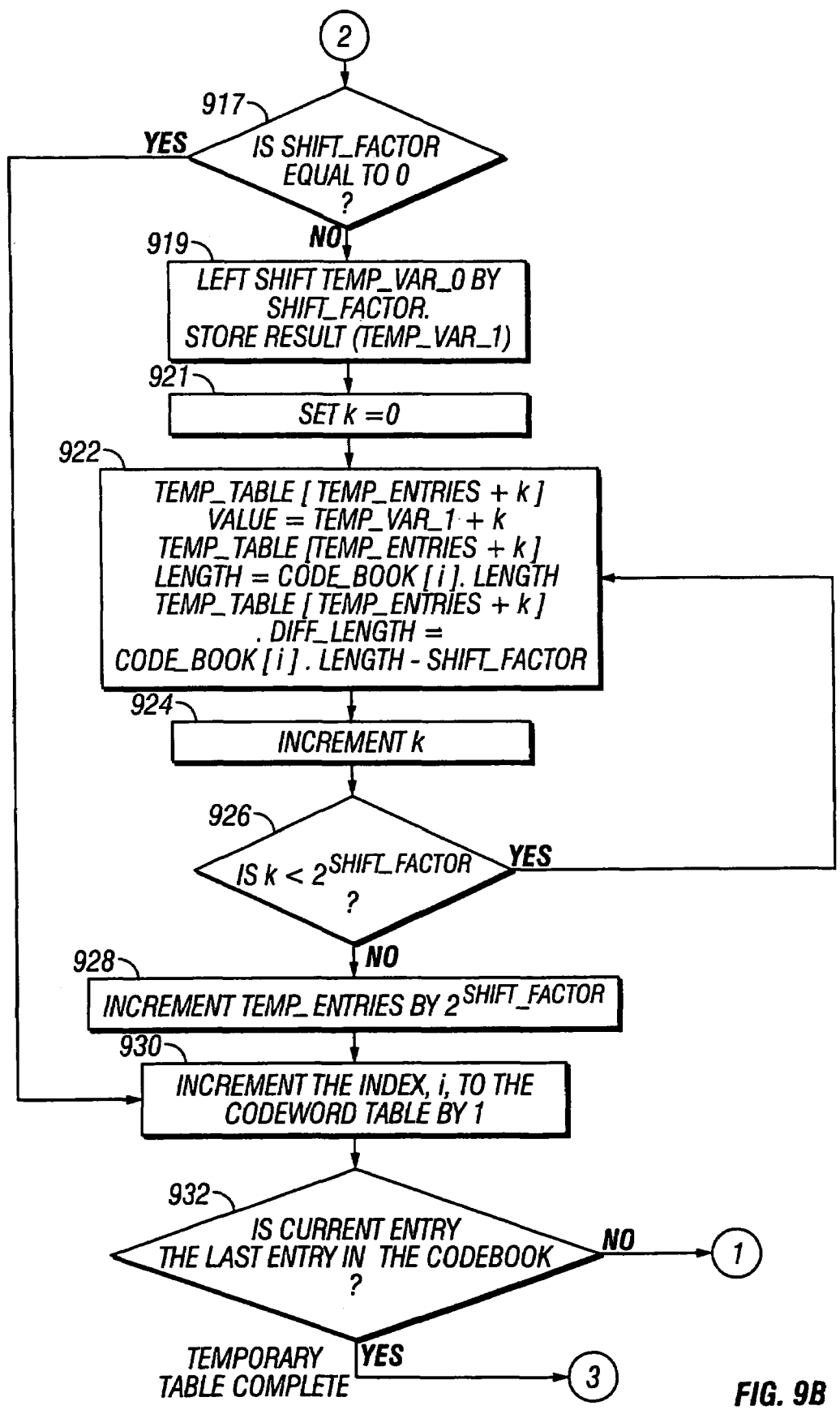
Figure 9C:
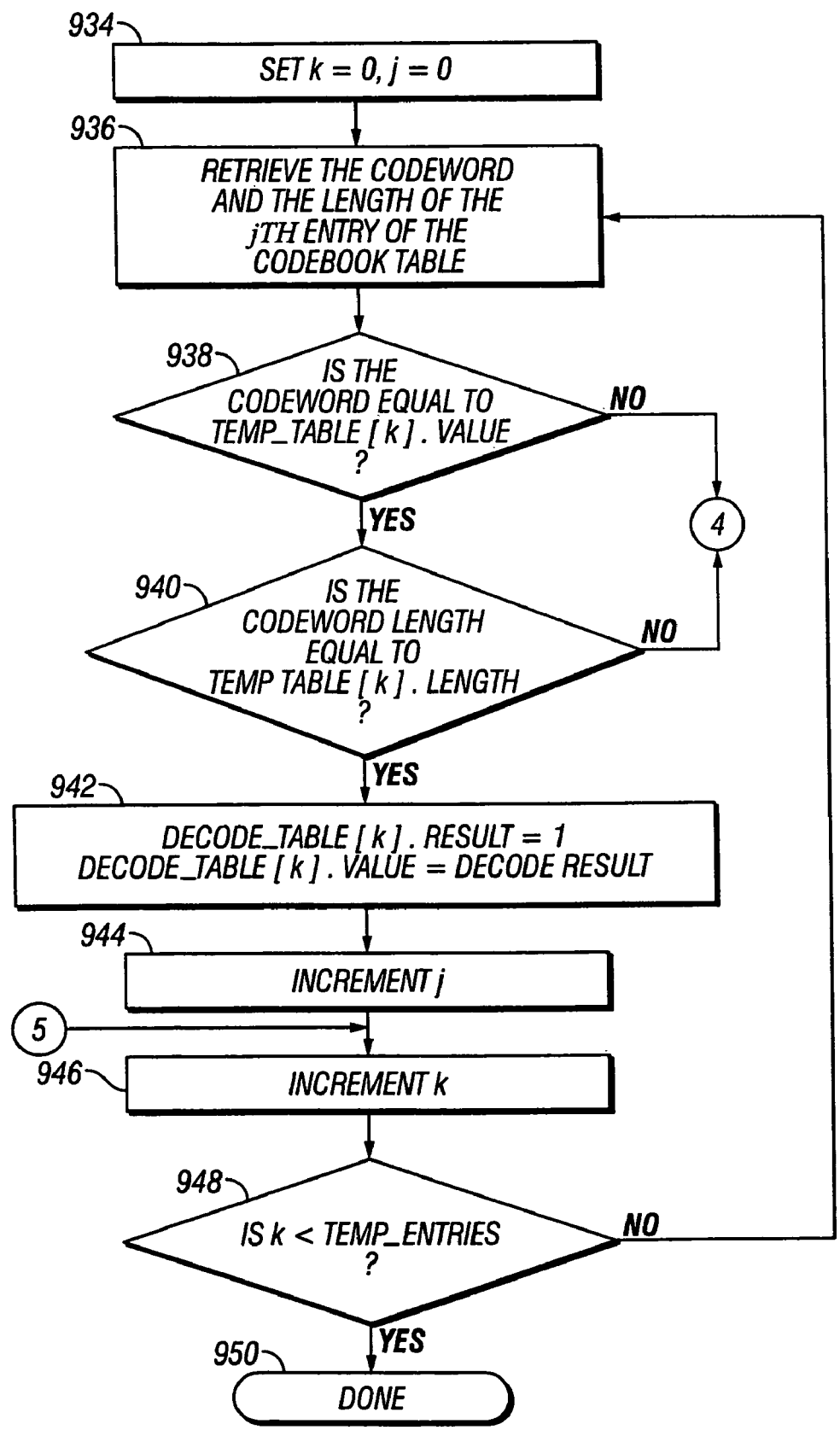
Figure 9D:
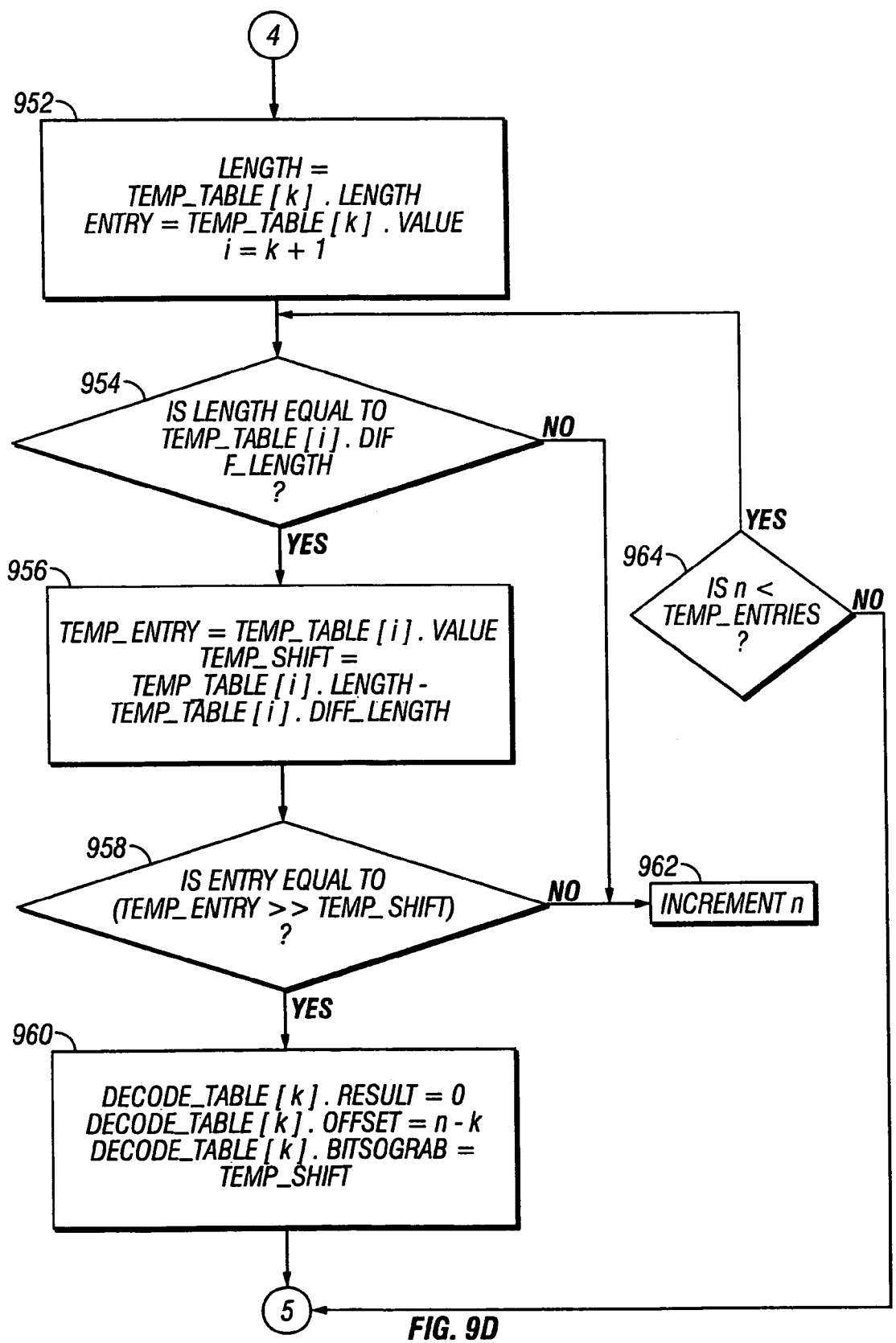

To further understand the principles of the present invention, an exemplary codebook 700 of FIG. 7 is further discussed. Codebook 700 is illustrative and does not necessarily represent an encoding scheme for a particular dataset. Codebook 700 includes eleven code words 702 encoding a corresponding set of results 704. In keeping with the understanding that the present inventive principles may be used with an encoding of an arbitrary dataset, the results have been generically labeled "Result 1"through "Result 11," respectively. The corresponding M-ary decode table 800 is shown in FIG. 8. Decode table 800 includes four subtables denoted Table 1–Table 4. Decode table 800 explicitly includes a column, index 802, containing the values of the indices for the respective entries. It would be understood by those of ordinary skill in the art that in an implementation of a decode table need not contain an explicit field containing the index as the index represents the entry address in the memory device in which the tables are stored. Entries 804 include result flags, entries 806 contain offsets (or, alternatively, portions of a result), and entries 808 contain numbers of additional bits to extract (or alternatively, remaining portions of a result) as previously described.

The decoding of an exemplary bitstream encoded in accordance with codebook 700 is now considered. For example, a bitstream containing the single code word "111101" (assumed transmitted from left to right) represents the "Result 9". (The base address is "zero" in FIG. 700). In accordance with step 502 of FIG. 5,, two bits are extracted from the bitstream (e.g., N=2 as the smallest code words are two bits long). Thus, the bits "11" are extracted and added to the base address in accordance with step 506 of FIG. 5, yielding the index or pointer value of three (3). This index or pointer points to entry 810 in decode table 800 of FIG. 8. The corresponding result flag contains the value "0" indicating that this entry does not include a result concomitant with "11" not being one of the code words 702 in codebook 700 of FIG. 7. The offset value field 806, entry 810 is "11" (step 520, FIG. 5), and the number of additional bits to extract is "10" (step 522 of FIG. 5). Thus in accordance with steps 524 and 526 of FIG. 5 respectively, the index 802 is offset by three to point to entry 812 of FIG. 8 corresponding to the base address of Table 3, and two additional bits "11" are extracted from the bitstream. Thus, the offset from the base address of Table 2 of FIG. 8 is three, corresponding to index value 9 in field 802 of entry 814. Again, the result flag, column 804 of entry 814, has the value "0" indicating that the value in fields 806 and 808 respectively represent an offset value and a number of additional bits to grab. (Note that "1111" is not a code word of codebook 700 of FIG. 7.) The offset value of "01" in field 806 of entry 814 of FIG. 8 indicates that the base address of the next subtable, Table 4, is offset from the present index by one (1), and the number of additional bits to extract for the bitstream, field 808, entry 814 is two or binary "10." The next two bits (which are the last two bits of the exemplary bitstream) are "01" and indexing into Table 4 by one points to entry 816 with index value 11. The corresponding result flag, field 804 has the value "1" indicating that fields 806 and 808 contain a decoded result, here denoted as "Result 9"concomitant with the bitstream "111101" representing a code word 702 of codebook 700 of FIG. 7 corresponding to the encoded value of "Result 9."

A process for generating an M-ary decode table for an arbitrary Huffman codebook 900 is illustrated in flowchart form in FIG. 9. Process 900 may be used to generate a decode table for a predetermined, arbitrary Huffman codebook.

In step 902, the codebook is sorted into increasing code word length. In particular, in process 900, the codebook may be represented as a data structure with each entry including a member (or, equivalently, field) containing the code word and another containing the length of the code word. As would be appreciated by artisans of ordinary skill in the art, in this way, the code words may be "padded" to correspond to conventional primitive data types used in programming languages (e.g. byte, integer, long integer, etc.). The length field of the ith entry of the codebook may be denoted by codebook [i]. length. Step 904 initializes a set of data structures. These initializations include a temporary table, discussed further hereinbelow in conjunction with step 922 (denoted temp_table) which is cleared (that is all entries set to zero) and two variables, one denoted temp_entries, which stores values utilized to generate indices into the temporary table, and an index, denoted i, into the sorted codebook. The temporary table may be represented by a data structure in which each entry includes a set of members, or equivalently fields, in which one field is utilized to contain a value which may, depending on the circumstances, be a code word, or may represent a portion of a code word, a second field is utilized to hold a code word length, and a third field utilized to contain the difference between the code word length and a value of shift_factor. These fields are set in step 922 below. The initial values of temp_entries and i are set to zero.

In step 906, the code word and length of the ith entry of the codebook are retrieved. Additionally, a variable, which will be used to shift the code word, denoted shift_factor is initialized to zero. In step 908, the code word is right shifted by shift_factor, and the result stored in a temporary variable, denoted temp_var_0. (Although the initial value of shift-_factor is zero, it may be subsequently incremented.)

In step 910, the temporary table is traversed in reverse order (that is, from the end to the start) and a test is made in step 912 to determine if temp_var_0 matches any value in the temporary table. (As described further in conjunction with step 922, the temporary table may be represented as a data structure in which each entry includes several members, or fields, one of which is the value tested in the matching step 912. The entries in the temporary table are updated in step 922 below.) If a match is found in step 914, it is determined if the length of the matched value in the temporary table is equal to the length of the code word in the ith entry of the codebook minus the value of shift_factor. If the length of the matched entry is equal to the difference between the length of the code word at the ith codebook entry and the value of shift_factor, process 900 proceeds to step 916 discussed below.

Otherwise, process 900 proceeds to step 918 in which value of shift_factor is incremented. Likewise, returning to step 912, if no match was found in traversing the temporary table, in step 910, process 900 also proceeds to step 918 to increment the value of shift_factor. Then, in step 920, the value of shift_factor is compared to the length of the code word in the ith entry of the codebook and, if the value of shift_factor is less than the length of the code word, process 900 returns to step 908 to repeat the steps of right shifting the code word (step 908) and traversing the temporary table to look for a match now with the code word right shifted by the new value of shift_factor from step 908.

Steps 908, 912, 918 and 920 repeat until either a match is found or the value of shift_factor equals the length of the code word of the ith codebook entry. If, in step 920, the value of shift_factor is not less than the code word ith entry of the codebook, process 900 proceeds to step 916.

In Step 917, a determination is made whether the value of shift_factor is zero. If so, then the matched value in the temporary table corresponds to a code word in the codebook, and process 900 proceeds to step 930 discussed below. If, however, the shift_factor is not equal to zero, then process 900 proceeds to fill out entries in the temporary table, in steps 917–926.

In step 917, the value of temp_var_0 is shifted left by the value of shift_factor. The value is stored in another temporary variable denoted temp_var_1. In step 921, a running index, denoted by the variable k is set equal to zero.

In steps 922–926, a loop over the running index k is entered. In step 922, the value field of the entry in the temporary table, indexed by the value of temp_entries+k is set equal to temp_var_1+k. (This table entry is denoted by Temp_table [temp_entries+k].value.) Additionally, the length field of the corresponding table entry is set equal to the length of the code word at the current (that is, ith) entry of the ordered codebook. (Denoted by Temp_table [temp_entries+k]. length and code_book [i]. length, respectively.) A third field of the corresponding entry of the temporary table contains the difference between the length of the code word at the current entry of the ordered codebook and the shift_factor. (Denoted by Temp_table [temp_entries+k]diff_length.) In step 924, the value of the running index k is incremented, and in step 926, it is determined if the new value of the running index is less than $2^{shift\_factor}$. If so, process 900 returns to step 922.

Otherwise, process 900 breaks out of the loop and in step 928, the value in temp_entries is incremented by $2^{shift\_factor}$. In step 930, the index into the code word table, i, is incremented, and in step 932, a determination is made whether the entry just processed is the last entry in the codebook table, that is, if the value of the index resulting from step 930 indexes past the last entry in the codebook table. If the last code word processed is not the last entry in the code word table, process 900 returns to step 906 to generate the temporary table values corresponding to the next code word in the codebook. Conversely, if the last code word processed is the last entry in the codebook, then the temporary table is complete, and process 900 proceeds to step 934 and the running index, k is set to zero. Additionally, a second running index, j, is also initialized to zero. Running index j will be used to index into the codebook to generate the decode table, such as exemplary table 800 of FIG. 8 from the values in the temporary table.

In step 936, the code word and the code word length for the jth entry of the codebook are retrieved. In step 938, the code word is compared to the kth entry of the temporary table. In step 940, the code word length retrieved in step 936 is compared to the value in the length field of the kth entry of the temporary table. If the code word length and the length value in the kth entry of the table are equal, then, in step 942, the result field of the kth entry of the decode table (denoted decode_table [k].value) is set equal to one and the value field of the kth entry of the decode table (denoted decode_table [k].result) is set equal to the code word at the jth entry of the codebook. The values of the running indices j and k are incremented in steps 944 and 946, respectively. If, in step 948, the value of the running index k is less than the value of temp_entries, then the decode table is complete and process 900 terminates at step 950. Otherwise, process 900 returns to step 936 to generate the table entries for the next code word in the ordered codebook.

Returning to steps 938 and 940, if either test failed, that is, either the code word in the jth entry of the codebook is not equal to the value in the corresponding field of the kth entry of the temporary table (step 938) or the value in the length field of the kth entry of the temporary table is not equal to the length of the code word in the jth entry of the codebook, then process 900 proceeds to step 952.

In step 952, a variable (denoted Length) is set equal to the length field of the kth entry of the temporary table, and a second variable (denoted Entry) is set equal to the value field of the temporary table. Additionally, an index (denoted n) is set equal to k+1.

In step 954, the value stored in Length is compared to the value in the diff_length field of the nth entry of the temporary table. If, in step 954, these values are equal, process 900 proceeds to step 956. Otherwise, process 900 proceeds to step 962 described below.

In step 956, the entry of the temporary table is stored in a variable (denoted Temp_entry) and, additionally, the difference between the value in the length field of the nth entry of the temporary table and the diff_lenth field of the nth entry of the temporary table is also stored in a variable (denoted Temp_shift). In step 958, the value of Temp_shift is right-shifted by the value of Temp_entry and the result compared to the value in Entry. If these are equal, then, in step 960, the values in the kth entry of the decode table are set. In particular, the result field is set to zero, the offset portion (denoted decode_table [k].offset) is set to n–k, and the portion of the entry representing the number of additional bits to grab (denoted decode_table [k].bitsograde) is set to the value of Temp_shift. Process 900 then returns to step 946 to process the next entry in the temporary table.

Returning to step 958, if the value stored in Entry is not equal to the value of Temp_shift right-shifted by the value of Temp_entry, then in step 962, the value of the running index n is incremented, and if, in step 964, the resulting value of n is less than the number of entries in the temporary table (Temp_entries), process 900 returns to step 954 to repeat steps 954–958 for the next entry in the temporary table. If, however, the value of n, is not less than the number of entries in the temporary table, process 900 returns to step 946 to process the next code word in the codebook (or terminate, if the last code word has been processed).

Returning to step 954, if the test in step 954 fails, that is, the value stored in Length is not equal to the value in the diff_length field of the nth entry of the temporary table, then process 900 proceeds to the next entry in the temporary table, or alternatively, if all entries in the temporary table corresponding to the current codebook entry have been processed, to the next entry in the codebook via steps 962 and 964 as previously described.

In an implementation of process 900 using a conventional high level programming language, such as C, C++ etc., the data structure representing the decode table may have the values "padded" to correspond to a data type defined in the language. However, the values may alternatively be stored in a hardware decode table, for example, in a packed binary form. The AAC bitstream represents a particularly demanding decoding task, and the present inventive principles have been illustrated in that context. However, the present invention may be used with any Huffman encoding scheme (or codebook). For example, in addition to AAC (e.g. MPEG-2 AAC and MPEG-4 AAC), other audio compression algorithms using Huffman encoding, such as MPEG-1 Layer 3 (MP3) may be decoded using the present invention. Likewise, video compression algorithms, such as MPEG-1, 2 and 4, voice compression algorithms, and image compression algorithms based on Huffman encoding also may be decoded by using the present inventive principles embodied in the methodology of FIG. 9 to generate the corresponding M-ary table.

A comparison of the memory usage (in words of four bytes each) of three decoding schemes for decoding the aforementioned twelve Huffman codebooks defined in the AAC is shown in FIG. 10 in tabular form. (Need to label the columns of FIG. 10.) The codebooks are listed in column 1002. The memory requirements for the M-ary decode process of the present invention are set forth in column 1004. The memory requirements to store the tree for a binary search are shown in column 1006. Column 1008 sets forth the memory requirements to store the tables for the two-table lookup mechanism described in the coassigned U.S. Pat. No. 6,504,496 entitled "SYSTEMS AND METHODS FOR DECODING COMPRESSED DATA," which is hereby incorporated herein by reference. This patent also briefly describes the process for decoding Huffman encoded bitstreams using a binary tree.

Figure 11:
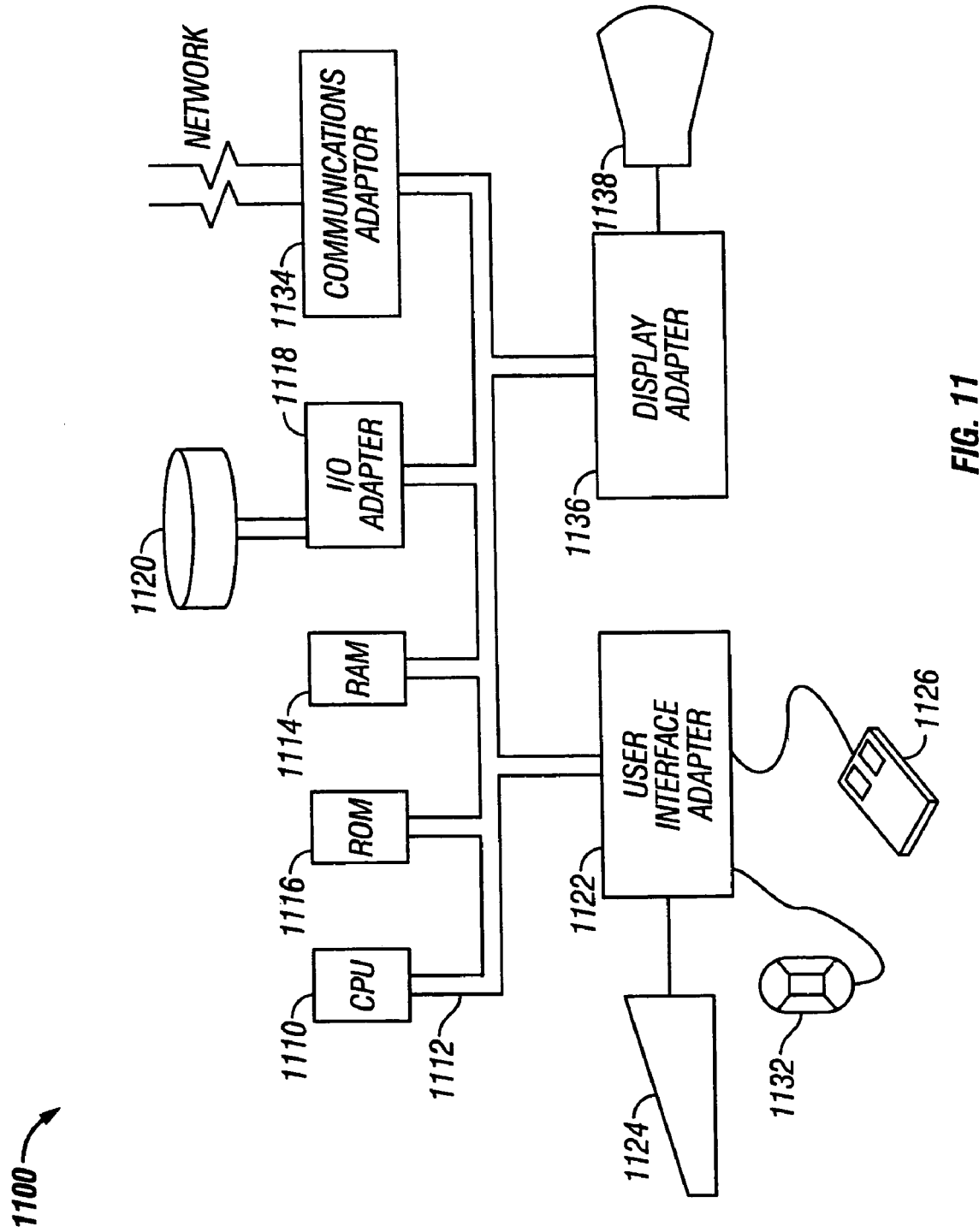
FIG. 11 illustrates, in block diagram form, a data processing system which may be used in conjunction with the methodology of FIGS. 9A–9C.

FIG. 11 illustrates an exemplary hardware configuration of data processing system 1100 in accordance with the subject invention. The system in conjunction with the methodologies illustrated in FIGS. 9A to 9C, for example, may be used, in accordance with the present inventive principles. Data processing system 1100 includes central processing unit (CPU) 1110, such as a conventional microprocessor, and a number of other units interconnected via system bus 1112. Data processing system 1100 also includes random access memory (RAM) 1114, read only memory (ROM) 1116 and input/output (I/O) adapter 1118 for connecting peripheral devices such as disk units 1120 to bus 1112, user interface adapter 1122 for connecting keyboard 1124, mouse 1126, trackball 1132 and/or other user interface devices such as a touch screen device (not shown) to bus 1112. System 1100 also includes communication adapter 1134 for connecting data processing system 1100 to a data processing network, enabling the system to communicate with other systems, and display adapter 1136 for connecting bus 1112 to display device 1138. CPU 1110 may include other circuitry not shown herein, which will include circuitry commonly found within a microprocessor, e.g. execution units, bus interface units, arithmetic logic units, etc. CPU 1110 may also reside on a single integrated circuit.

Preferred implementations of the invention include implementations as a data processing system programmed to execute the method or methods described herein, and as a program product. According to the data processing system implementation, sets of instructions for executing the method or methods are resident in the random access memory 1114 of one or more computer systems configured generally as described above. These sets of instructions, in conjunction with system components that execute them may be used to generate decode tables as described hereinabove. Until required by the data processing system, the set of instructions may be stored as a program product in another memory, for example, in disk drive 1120 (which may include a removable memory such as an optical disk or floppy disk for eventual use in the disk drive 1120). Further, the program product can also be stored at another data processing system and transmitted to the user's work station by a network or by an external network such as the Internet. One skilled in the art would appreciate that the physical storage of the sets of instructions physically changes the medium upon which they are stored so that the medium carries computer readable information. The change may be electrical, magnetic, chemical, biological, or some other physical change. While it is convenient to describe the invention in terms of instructions, symbols, characters, or the like, the reader should remember that all of these in similar terms should be associated with the appropriate physical elements.

The invention may describe terms such as comparing, validating, selecting, identifying, or other terms that could be associated with a human operator. However, for at least a number of the operations described herein, which form part of at least one of the embodiments, no action by a human operator is desirable. The operations described are, in large part, machine operations processing electrical signals to generate other electrical signals.

Although the present invention and its advantages have been described in detail, it should be understood that various changes, substitutions and alterations can be made herein without departing from the spirit and scope of the invention as defined by the appended claims.

What is claimed is:

1. A decoding method comprising:
(a) extracting a preselected number of bits from a bitstream to be decoded;
(b) accessing a table entry of a table using an index generated in response to the extracted bits; and
(c) if a first value in the table entry indicates a second value in the table entry comprises a decoded result, retrieving said decoded result.

2. The method of claim 1 further comprising:
(d) if said first value in the table entry indicates a second value in the table entry does not comprise a decoded result, accessing the next table entry in said table in response to said second value.

3. The method of claim 1 wherein the index comprises a sum of the value of the extracted bits and a base address of said table.

4. The method of claim 2 wherein if said first value indicates said second value does not comprise a decoded result, said second value comprises a first portion and a second portion, the first portion of said second value comprising an offset, and said second portion comprising an additional number of bits to extract from said bitstream.

5. The method of claim 4 further comprising:
(e) offsetting a current index by the first portion of the second value;
(f) extracting a number of bits from said bitstream equal to the second portion of the second value; and
(g) offsetting the current index by a value of the extracted bits equal to the second portion of the second value to generate a next pointer into the table.

6. The method of claim 5 further comprising:
(h) accessing the table using the pointer generated in step (g);
(i) if a first value in the entry accessed in step (h) indicates a second value in the entry comprises a decoded result, retrieving said decoded result; and
(j) if said first value in the entry accessed in step (h) indicates a second value in the entry does not comprise a decoded result, accessing a next entry in said table in response to said second value.

7. The method of claim 6 further comprising:
(k) repeating steps (e)–(j) until all bits in said bitstream are decoded.

8. A signal processing system comprising:
an input port configured to receive an encoded digital signal; and
a processor including a decoder,
memory, including a table having a plurality of entries, each entry having a first portion and a second portion, wherein the decoder is coupled to the table, and wherein said decoder comprises:
logic for extracting a preselected number of bits in a bitstream of said encoded digital signal;
logic for addressing an entry in said table in response to the preselected number of bits; and
logic for retrieving a decoded value if a value the first portion of an addressed entry indicates a value in the second portion of the addressed entry comprises a decoded result.

9. The system of claim 8 wherein said logic for addressing an entry in said table further comprises logic for addressing a next entry in said table if the first value in the entry indicates the second value does not comprise a decoded result.

10. The system of claim 9 wherein if said first value indicates said second value does not comprise a decoded result, said second value comprises a first portion and a second portion, the first portion of said second value comprising an offset value, and said second portion comprising an additional number of bits to extract from said bitstream.

11. The system of claim 10 wherein said decoder further comprises:
logic for offsetting a current index by the first portion of the second value; and
logic for extracting a next number of bits from said bitstream equal to the value in the second portion of the second value.

12. The system of claim 11 further comprising logic generating a next pointer into the table, the logic including logic for further offsetting the current index by a value of the next number of bits extracted from said bitstream.

13. The system of claim 12 wherein the decoder further comprises:
logic for accessing the table using said next pointer; and
logic for repeating the operations of:
retrieving a decoded value if a value of the first portion of an addressed entry indicates a value in the second portion of the addressed entry comprises a decoded result; and
addressing a next entry in said table if the first value in the entry indicates the second value does not comprise a decoded result.

* * * * *